(12) United States Patent
Winiecki et al.

(10) Patent No.: US 10,707,841 B1
(45) Date of Patent: Jul. 7, 2020

(54) DRIVING CIRCUIT FOR SINGLE CRYSTAL RTC AND RF CLOCK

(71) Applicant: Sequans Communications S.A., Colombes (FR)

(72) Inventors: Thomas Winiecki, Colombes (FR); Peter Martin, Colombes (FR)

(73) Assignee: SEQUANS COMMUNICATIONS S.A., Colombes (FR)

( * ) Notice: Subject to any disclaimer, the term of this patent is extended or adjusted under 35 U.S.C. 154(b) by 0 days.

(21) Appl. No.: 16/271,411

(22) Filed: Feb. 8, 2019

(51) Int. Cl.
*H03K 3/012* (2006.01)
*H03F 3/21* (2006.01)
*H03K 3/037* (2006.01)

(52) U.S. Cl.
CPC ............... *H03K 3/012* (2013.01); *H03F 3/21* (2013.01); *H03F 2200/451* (2013.01); *H03K 3/037* (2013.01)

(58) Field of Classification Search
None
See application file for complete search history.

(56) References Cited

U.S. PATENT DOCUMENTS

| | | | |
|---|---|---|---|
| 6,529,180 B1* | 3/2003 | Ito | G09G 3/3688 345/100 |
| 7,710,212 B2* | 5/2010 | Seliverstov | H03B 5/06 331/158 |
| 2008/0247338 A1* | 10/2008 | Kim | H03F 3/195 370/280 |
| 2009/0088194 A1 | 4/2009 | Petty, Jr. et al. | |

FOREIGN PATENT DOCUMENTS

WO   2012/166140 A1   12/2012

* cited by examiner

*Primary Examiner* — Cassandra F Cox
(74) *Attorney, Agent, or Firm* — Hamilton, Brook, Smith & Reynolds, P.C.

(57) ABSTRACT

A crystal driving circuit comprising a circuit input node and a circuit output node, a high power amplifier having a power consumption of more than 100 μW, a low power amplifier comprising a power consumption less than 10 μW, the circuit being arranged to selectively isolate the high power amplifier and associated load capacitance from the circuit input node and the circuit output node.

20 Claims, 6 Drawing Sheets

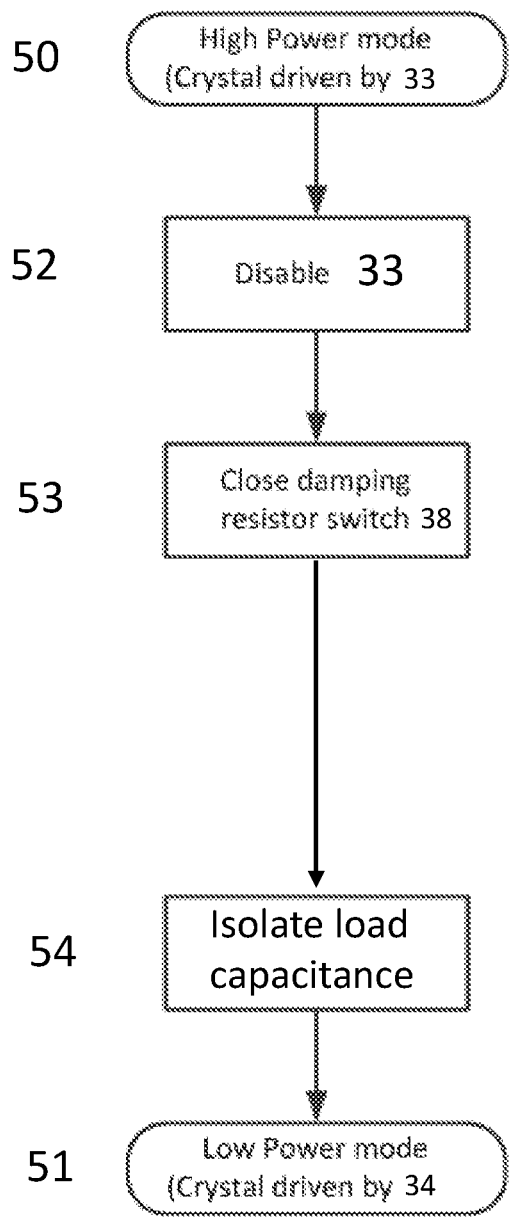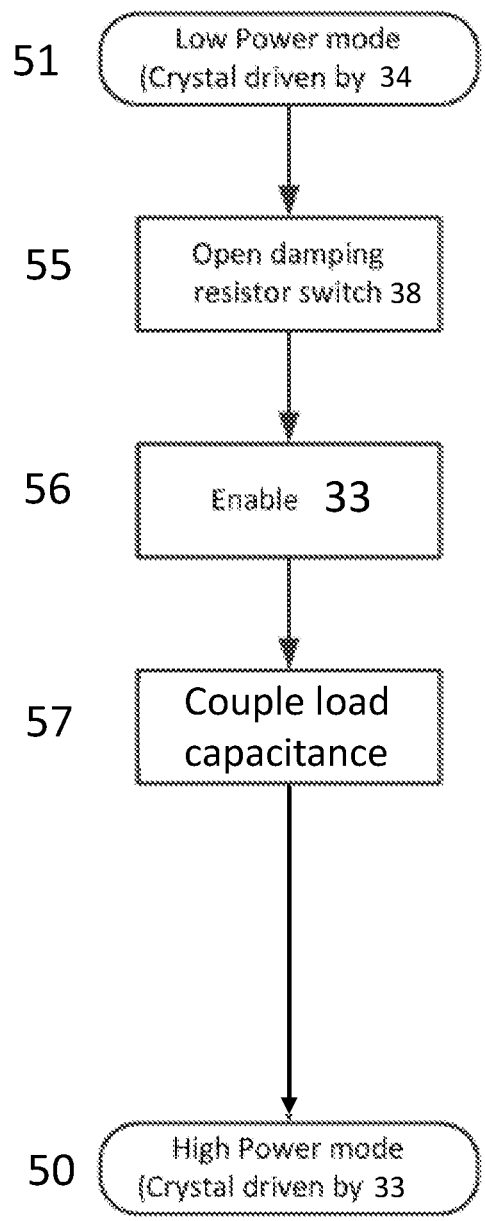
Figure 5A
Figure 5B

DRIVING CIRCUIT FOR SINGLE CRYSTAL RTC AND RF CLOCK

TECHNICAL FIELD

This disclosure relates to providing a circuit that allows a single crystal to provide reference clocks for both a real time clock (RTC) and a radio frequency (RF) transceiver. It is particularly suited, but by no means limited, to battery operated wireless communications devices.

BACKGROUND

Battery operated wireless communication devices commonly use two separate reference clocks to fulfil separate functions in the system that must meet very different requirements.

A low frequency clock, typically 32.768 kHz, serves as time keeper, in particular during sleep or idle modes. This is often referred to as real-time clock (RTC). The implementation of the RTC focuses on minimizing power consumption. A typical RTC design consumes around a microwatt of power. Phase noise, especially at high frequency, is of no concern.

A second higher frequency clock, for example 26 MHz, 38.4 MHz or 48 MHz, is often used as a reference signal for one or more phase-locked loops from which receiver and transmitter carrier signals can be derived. With complex modulation schemes, the key performance parameter is phase noise. The drive strength of the crystal is important for phase noise because phase noise is the ratio of undesired power (in the surrounding frequency spectrum) to desired power at the oscillation frequency. Phase noise can be minimized by keeping circuit noise low and to use moderate to large signal swings (high and low levels) so that any circuit added noise represents a small perturbation in relative terms.

When the reference signal is scaled up to a carrier frequency the phase noise increases with the square of the frequency scaling factor. This mechanism makes it virtually impossible to use a low frequency like 32.768 kHz (typical RTC frequency) as a reference for RF signals.

The physical properties of low and high frequency crystal resonators are also very different which explains why different circuit architectures are typically used to drive them. Most RTC crystals are constructed based on a tuning-fork shaped resonator. Higher frequencies are generated using AT cut crystals vibrating in thickness sheer mode as would be understood.

FIG. 1 illustrates the electrical differences between typical RTC crystals and typical higher frequency crystals for RF when represented as a linear lumped model.

In this model, the so-called motional inductance is labelled 11, the motional capacitance 12, the equivalent series resistance 13, the shunt capacitance 14 and external (to the crystal package 17) load capacitors 15 (C1) and 16 (C2). The table below shows parameters for commonly available quartz crystals

| Parameter | Typical RTC | Typical ref clock for RF |
|---|---|---|
| Nominal freq | 32.768 kHz | 38.4 MHz |
| (11) Motional inductance, $L_M$ | 6.7 kH | 5.7 mH |
| (12) Motional capacitance, $C_M$ | 3.5 fF | 3.0 fF |
| (14) Shunt capacitance, $C_P$ | 2.0 pF | 1.5 pF |
| Total load capacitance, $C_{TOT}$ | 10 pF | 10 pF |
| (13) Serial resistance, $R_S$ | 50 kΩ | 60 Ω |

The lumped model parameters relate to various properties of an oscillator built around a particular crystal resonator. For example, for small series resistance values the oscillation frequency, $f_{OSC}$, is given by the following expression (where Sqrt=square root):

$$2\pi \cdot f_{OSC} = \omega_{OSC} = \text{Sqrt}\,[1/L_M(1/C_M + 1/C_L)],$$

where $C_L = C_P + C_1 C_2/(C_1 + C_2)$ is the total load capacitance seen by the crystal resonator.

The motional capacitance, $C_M$, is much smaller than the load capacitance. Therefore, the oscillation frequency is close to the self-resonant point between motional inductance and motional capacitance given by what is called the series resonant frequency:

$$f_S = 1/(2\pi)/\text{Sqrt}\,[L_M \cdot C_M].$$

Large load capacitances $C_1$ and $C_2$ increase the oscillation frequency slightly;

smaller load capacitances shift the frequency further away from $f_S$. This mechanism is commonly used in digitally controlled crystal oscillators (DCXO) to fine-tune the crystal to the desired frequency. The nominal oscillation frequency $f_{OSC}$ is obtained when the crystal is loaded with the appropriate total load capacitance $C_L$ specified by the manufacturer. When a very small load is applied the frequency of oscillation will be higher and close to the series resonant frequency as would be understood.

The series resistance dampens any oscillations between the inductor and the capacitors. To maintain constant amplitude, a feedback current must be added into the crystal. This is normally achieved using a gain stage sensing the voltage at one port (21A, 21B) of the crystal and injecting current into the second crystal port (21B, 21A) in anti-phase with the sensed voltage. This voltage-to-current or transconductance stage 20 (Gm) may be implemented as the well-known Pierce crystal oscillator as illustrated in FIG. 2. Another common arrangement is the Colpitts oscillator.

The load (tuning) capacitors 15, 16 can be tuned to change the oscillation frequency $f_{OSC}$ of crystal 21 as explained above.

In steady-state conditions the transconductance stage 20 adds just enough current into the loop to balance out losses in the crystal device, that is to say that the power dissipated in the crystal is replenished by the transconductance stage 20. This is known as the Barkhausen condition for oscillation. The required gain can be approximated by the expression below $$Gm = 4\omega_{OSC}^2 \cdot R_S \cdot C_L^2 \quad (1)$$

The power dissipation within the crystal is given by the power provided by the Gm current source, $P = \frac{1}{2} Gm V_P^2$, where $V_P$ is the amplitude of the voltage signal across the crystal ports (21A, 21B). This must equal the power dissipated across the series resistor, $P = \frac{1}{2} R_S I_R^2$, therefore, $$I_R = V_P \cdot \text{Sqrt}(Gm/R_S).$$

The current generated by the Gm stage has an amplitude given by $I_G = Gm \cdot V_P$. This current is smaller, typically much smaller, than the current amplitude through the resistor $I_G/I_R = \text{Sqrt}(Gm \cdot Rs) = \omega_{OSC} \cdot R_S \cdot C_L < 1$.

In other words, most of the current flows between the crystal and the load capacitors. The amplitude of the current passing through the load capacitor is given by $I_C = \omega_{OSC} \cdot C_L \cdot V_P$. It is 90° out of phase with the current generated by the Gm stage, $I_G^2 + I_C^2 = I_R^2$.

The total amount of energy stored contained in the oscillation can be expressed in terms of the magnetic energy stored on the motional inductance, $E = \frac{1}{2} L_M I_R^2$. Alternatively, energy may be expressed in terms of the electric field energy held by the motional capacitor $E = \frac{1}{2} C_M V_M^2$, where $V_M = (C_L / C_M) V_P$. The load capacitors store only a tiny fraction of the overall energy contained in the system when $C_M \gg C_L$.

Without feedback, oscillations decay exponentially with a time constant given by $\tau = 2Q / \omega_{OSC}$. The quality factor $Q = \omega_{OSC} L_M / R_S$ is typically very large, in the order of tens or hundreds of thousands. This means the circuit reacts very slowly to any changes in external drive level.

When comparing low frequency and high frequency crystal resonators, one finds that the Gm needed to maintain oscillations (see Eqn (1)) of a high frequency crystal is several orders of magnitude larger than the one to sustain low frequency oscillation. With the figures in the above table, the 32.768 kHz crystal can resonate with a Gm of 1 μS (siemens) whereas the 38.4 MHz quartz must be driven with 1,000 μS. If the same amplitudes are used, the power dissipation of the two crystals differs by a factor of more than a thousand. Typical RTC oscillators consume less than 1 μW whereas high frequency DCXOs consume just over 1 mW.

For RTC oscillators the standard design approach is to use a digital invertor gate. Compared to the high frequency design this has much reduced Gm and noise requirements but also consumes much less current.

There exist several challenges to overcome when attempting to use a single high frequency crystal resonator in a dual mode driver circuit.

(A) How can the drive level (voltage and current amplitude) be lowered whilst keeping Gm almost unchanged? Compared to established high frequency designs power consumption must reduce by a factor of around 1,000 but at the same time Gm must be 1,000 times larger than that used in standard RTC buffer designs.

(B) How can most of the load capacitance be switched in or out without disturbing the oscillation? In particular, when the load capacitance is lowered, for example from 10 pF to 2 pF, the instantaneous voltage across the crystal can increase by a factor of 5, enough to potentially damage the Gm stage device.

Accordingly there is a need to design a circuit and method to overcome these challenges.

SUMMARY

In an aspect there is provided a crystal driving circuit as defined in claim 1. Accordingly, there is provided a crystal driving circuit comprising a circuit input node and a circuit output node, a high power amplifier having a power consumption of more than 100 μW, a low power amplifier comprising a power consumption less than 10 μW, the circuit being arranged to selectively isolate the high power amplifier and associated load capacitance from the circuit input node and the circuit output node.

The circuit of claim 1 wherein being arranged to selectively isolate the high power amplifier and associated load capacitance from the crystal driving circuit comprises the high power amplifier being in a tri-state mode.

Optionally, the circuit further comprising a switch positioned in series with the input node and/or a switch positioned in series with the output node to selectively isolate the high power amplifier and associated load capacitance from the crystal driving circuit.

Optionally, the circuit further comprising at least one switch positioned in series with capacitive elements of the associated load capacitance to selectively isolate the associated load capacitance from the crystal driving circuit.

Optionally, the circuit further comprising a damping resistor coupled in parallel with the input node and the output node and arranged to dampen oscillations and dissipate power from a crystal coupled across the input and output node.

Optionally, the circuit wherein the outputs of the amplifiers are coupled to the output node and the inputs of the amplifiers are coupled to the input node.

Optionally, the circuit wherein the load capacitance of the circuit between the input node and the output node is contained solely on the integrated device.

Optionally, the circuit further comprising a low power frequency divider to provide a frequency signal for a real time clock.

Optionally, the circuit wherein the high power amplifier is coupled to a low noise power supply.

Optionally, the circuit wherein the low power amplifier is coupled to an unregulated power supply.

Optionally, the circuit wherein the circuit is further arranged to selectively isolate the low power amplifier from the crystal driving circuit.

Optionally, the circuit wherein the driving circuit is positioned on an integrated device.

Optionally, the circuit comprising a crystal coupled across the input node and the output node.

Optionally, the circuit wherein the crystal is positioned external to the integrated device.

In a further aspect there is provided a method as defined in claim 13. Accordingly, there is provided a method of driving a crystal driving circuit, the method comprising operating in a low power mode whereby the high power amplifier and associated load capacitance is selectively isolated from the crystal driving circuit.

Optionally, the method wherein selectively isolating the high power amplifier and associated load capacitance from the crystal driving circuit comprises:
  disabling the high power amplifier by operating the high power amplifier in a tri-state mode or powering down the high power amplifier; and then
  opening a switch positioned in series with the input node and before the high power amplifier input; and/or opening a switch positioned in series with the output node before the high power amplifier output.

Optionally, the method wherein selectively isolating the high power amplifier and associated load capacitance from the crystal driving circuit comprises:
  disabling the high power amplifier by operating the high power amplifier in a tri-state mode or powering down the high power amplifier; and then
  opening at least one switch positioned in series with capacitive elements of the associated load capacitance.

Optionally, the method wherein selectively isolating the high power amplifier and associated load capacitance from the crystal driving circuit further comprises selectively coupling a damping resistor across the input and output nodes after the disabling the high power amplifier and before the opening a switch.

Optionally, the method further comprising operating in a high power mode whereby the high power amplifier and associated load capacitance is selectively coupled to the crystal driving circuit.

Optionally, the method wherein selectively coupled to the high power amplifier and associated load capacitance comprises powering the high power amplifier and operating it in a non tri-state mode, then closing a switch positioned in series with the input node and before the high power amplifier input; and/or closing a switch positioned in series with the output node and before the high powered amplifier output.

Optionally, the method wherein selectively coupled to the high power amplifier from the crystal driving circuit further comprises selectively isolating a damping resistor from across the input and output nodes before powering the high powered amplifier.

In a further aspect there is provided a non-transient computer readable medium as defined in claim 20, the computer readable medium comprising instructions that when executed by a processor, cause the processor to carry out the method of the previous aspect.

BRIEF DESCRIPTION OF THE DRAWINGS

Embodiments will now be described, by way of example only, and with reference to the drawings in which:

FIG. 5A illustrates transitioning from the high power mode to the low power mode;

FIG. 5B illustrates transitioning from the low power mode to the high power mode;

In the figures, like elements are indicated by like reference numerals throughout.

OVERVIEW

A scheme is disclosed in which the high frequency clock may also be used as a real time clock during sleep and idle modes. That is to say that the high frequency resonator is also run in a mode with comparable power consumption as a low frequency tuning fork resonator, such as that typically used for an RTC. This eliminates the need for the low frequency resonator.

Throughout, it is assumed that the resonators are quartz crystals. However, the concepts disclosed herein equally apply to other resonator structures, for example micro-electro-mechanical systems (MEMS) based implementations.

DETAILED DESCRIPTION

Figure 3:
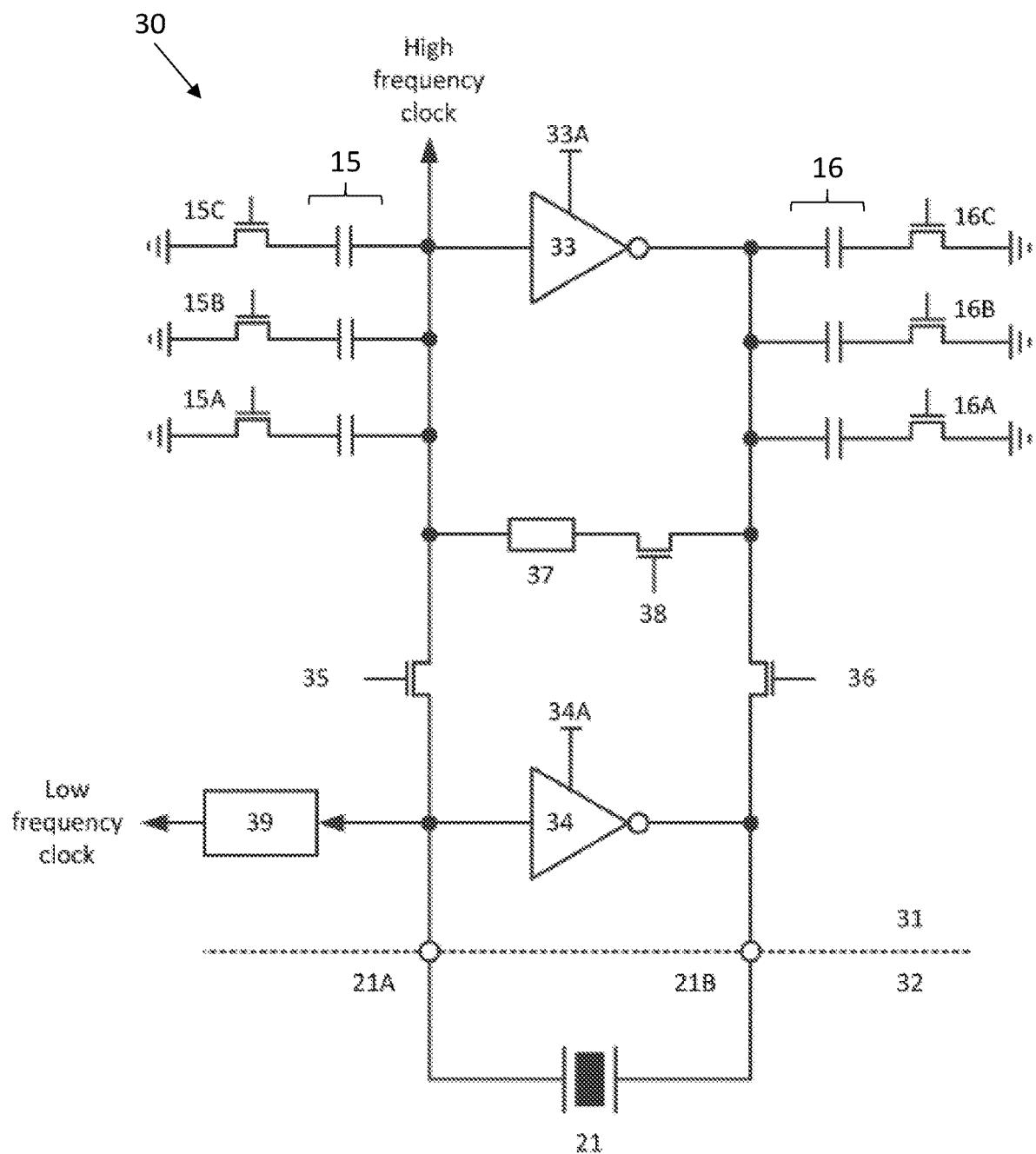
FIG. 3 illustrates a crystal driving circuit according to the disclosure.

Turning to FIG. 3, a crystal driving circuit 30, preferably on-chip (31) is disclosed. FIG. 3 shows a Pierce oscillator. Other arrangements would work equally as well with the principles, techniques and methods described herein such as a Colpitts oscillator. The crystal driving circuit comprising a circuit input node 21A and a circuit output node 21B that may be coupled to a crystal resonator 21. The circuit comprises a high power amplifier 33 and a low power amplifier 34, both amplifier inputs may be coupled to the input node 21A and both amplifier outputs may be coupled to the output node 21B. Other arrangements are also suitable. The high power amplifier is preferably powered by a clean regulated low noise power supply 33A preferably having a noise power spectral density in the order of 180 μV rms integrated between 1 kHz to 10 MHz. The low power amplifier may be powered by an unregulated supply 34A. Optional load capacitance comprising capacitors 15, 16 and associated with the high power amplifier 33 are coupled to ground from the input and output node of the high power amplifier 33. The high power amplifier and any optional load capacitors may be selectively isolated from the crystal driving circuit 30. This can be achieved by way of operating the high power amplifier in a tri-state mode whereby each of its input and output are tri-stated. Optionally, switch devices 35, 36 are coupled in series with input node 21A and output node 21B respectively and are arranged so as to be able to isolate the high frequency amplifier and associated load capacitance 15, 16 from the crystal driving circuit 30 when one or both of the switch devices 35, 36 are open. Further, switches 15A-C and/or 16A-C may be positioned in series on either side of capacitor elements 15, 16 of the load capacitance (shown on the ground side in FIG. 3 but can also be positioned on the input and output nodes of the high power amplifier with the relevant capacitor coupled to ground) to enable gradual reduction and introduction of the load capacitance (as discussed later). The capacitors 15, 16 may also be connected differentially between input and output nodes of amplifier 33 rather than to ground. Any number of switches (15x, 16x) and capacitors (15, 16) may be used to allow higher or lower granularity and range as would be understood. An optional damping resistor 37 is selectively coupled in parallel to the input and output nodes 21A, 21B by way of a switch 38. A frequency divider 39 (preferably low power) may be coupled to input node 21A or output node 21B so that a low frequency clock signal suitable for an RTC can be provided (tapped) when the circuit is driving a crystal resonator 21.

Turning to certain individual components of FIG. 3, high power amplifier 33 is:

1. operable with a power consumption of >100 μW. Preferably able to sustain a differential voltage amplitude of more than 100 mV across its input and output (across a crystal when the driving circuit is coupled to a crystal). This keeps phase noise low enough so that the clock can be used as reference for an RF frequency generator used for up- and down-conversion of wideband modulated RF signals.

2. able to drive a large enough load capacitance so that the oscillation frequency of the driving circuit is tuned to the nominal frequency of crystal resonator 21—this in turn requires a transconductance of around 1,200 μS (see Eqn (1))

Figure 1:
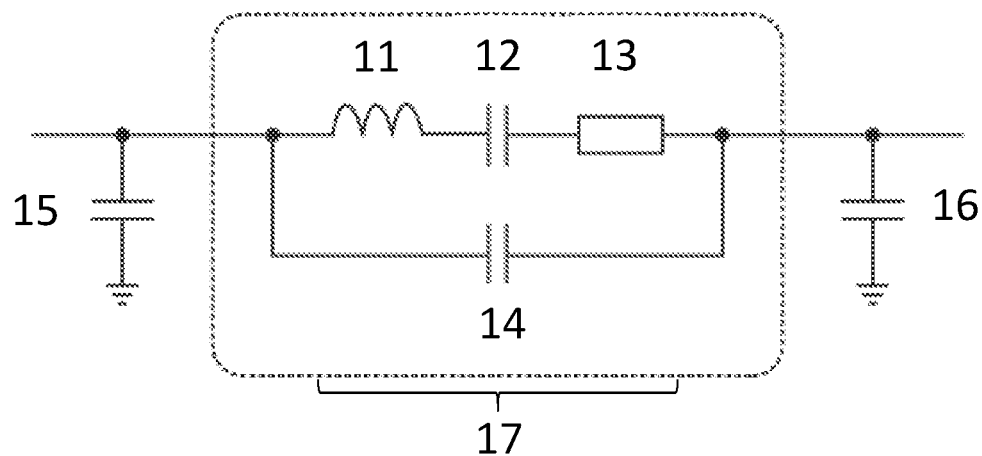
FIG. 1 illustrates the electrical differences between typical RTC crystals and typical higher frequency crystals for RF when represented as a linear lumped model.
Figure 2:
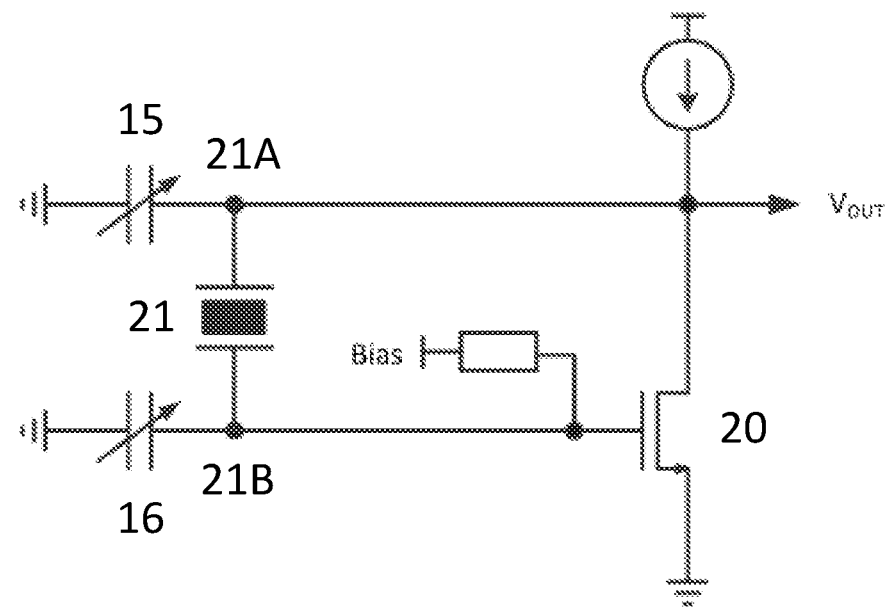
FIG. 2 illustrates a Pierce crystal oscillator.

The high power amplifier 33 is designed for best phase noise performance and can drive a crystal resonator 21 with sufficient load capacitance so that it resonates close to its nominal frequency. These characteristics are met with a Pierce amplifier as shown in FIG. 2 or other arrangements such as a Colpitts oscillator. The high power amplifier power consumption will be in the range of a milliwatt.

The low power amplifier 34 is operable with a power consumption of <10 μW. Optionally, low power amplifier 34 may have reduced transconductance which means it can only drive the crystal resonator 21 when the load capacitance is lower than the value recommended by the manufacturer. This will lead to oscillation frequencies higher than the nominal crystal frequency. As can be seen from FIG. 3, all load capacitance is integrated on the chip 31, no explicit load need be added externally.

The low power amplifier is designed for a power consumption of below ten microwatts, and preferably below 1 microwatt. This is achieved firstly by removing as much load capacitance as possible from the driving circuit when the lower power amplifier is operating to provide a low frequency output. This is achieved by the aforementioned tri-stating of the high power amplifier, the optional switches 35, 36, and/or the optional switches 15A-C and/or 16A-C to isolate the tuning capacitors 15 and 16. Having all load capacitance on-chip makes the isolating of load capacitance easier. Secondly a radically different amplifier design that limits current drive level to well below 1 μA and differential voltage swing to below 10 mV. An architecture for such an amplifier is described in FIG. 6.

In operation, if the total load capacitance can be reduced from greater than 10 pF to less than 2 pF (there may be some residual load capacitance due to parasitic elements) then the transconductance required by the low power amplifier is around 50 μS compared to around 1,200 μS (see Eq (1)) required by the high power amplifier when a resonator is coupled to the driving circuit.

Current consumption of the low power amplifier should ideally drop from around 500 μA to 0.5 μA (to reduce overall current consumption in low power mode to 1 μA, a value achieved with a standard 32 kHz crystal).

For a simple buffer such as that used for the low power amplifier, the ratio of drain current to transconductance (Ids/Gm) is a key metric (as it relates the current consumption to the gain of the amplifier). For the low power amplifier a very low drain current (Ids) is desired while at the same time keeping transconductance, Gm high enough to maintain oscillation (resonator dependent). Buffers of the same design deployed in parallel keep this ratio constant, as both current consumption and drive current scale proportionally with the number of stages used as would be understood.

A much lower Ids/Gm ratio (around 10 mV, based on Gm≥50 μS and Ids≤0.5 μA) is desired for the low power amplifier compared to the high power amplifier (with Ids/Gm around 400 mV). Therefore it is not possible to simply scale up to the high power design by using variable numbers of the same transistors. A modified architecture is illustrated in FIG. 6 for the low power amplifier.

Figure 6:
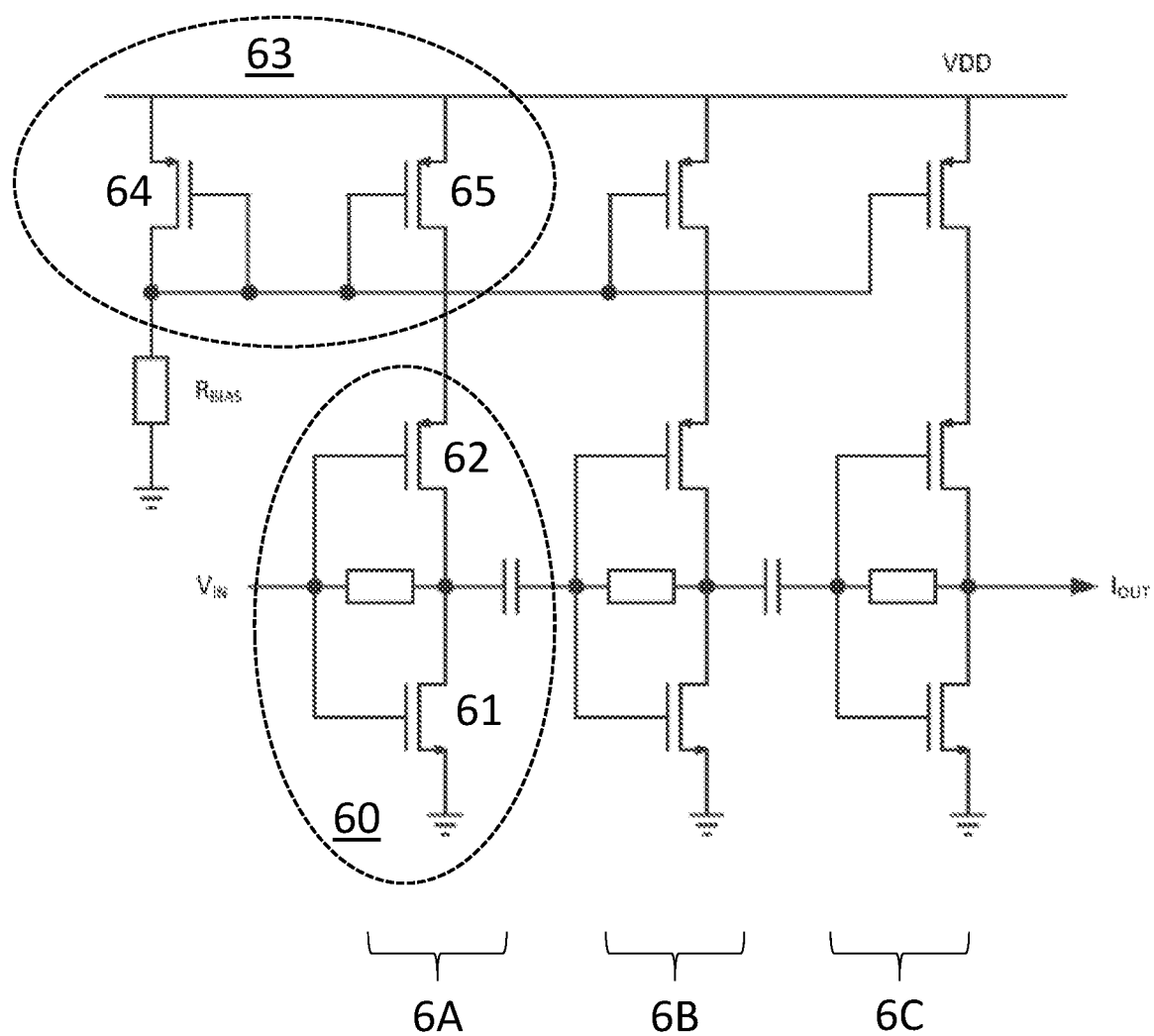
FIG. 6 illustrates a modified low power amplifier architecture.

FIG. 6 shows how a bias current set by a resistor is mirrored to a number of amplifier stages. The current mirror 63 is comprises two PMOS devices 64 and 65. Equally, NMOS devices could be used for mirroring current. The self-biased inverter 60 containing NMOS 61 and PMOS 62 cannot draw more current than is provided by the current mirror 63. This is often referred to as a current starved inverter. This arrangement limits the current drawn by the circuit across a very wide range of conditions. The invertor is held in saturated biasing conditions to minimize process and temperature variations. Furthermore, the transconductance of NMOS 61 and PMOS 62 add up without adding extra current consumption. In advanced CMOS technology it is just about possible to achieve the desired ratio of Ids/Gm<10 mV with a single inverter stage.

More generally, several cascaded stages may be used to boost gain. In FIG. 6, three inverter stages are shown (6A, 6B, 6C).

Note that the high power amplifier does not necessarily require several cascaded stages as the ratio of supply current to trans-conductance can be much higher but would operate with such an architecture.

In different semiconductor technology the ratio of current to transconductance may be different and other circuit topologies other than FIG. 6 may be more suitable. The overall strategy will still be to maximize transconductance but limit circuit current to an acceptable level for low power mode.

Architecture and function of the Frequency divider 39 (preferably a low power frequency divider) will now be described.

For time keeping it is normally not essential to generate a clock close to the default 32.768 kHz frequency of an RTC. Instead, any low frequency reference can be used as long as its value is known and stable. For example, a 38.4 MHz crystal frequency can be divided by 1,024 to get a 37.5 kHz reference for the sleep/Idle periods.

Note that when all load capacitance is removed the resonator 21 may speed up by around 600 ppm. This also means the divided clock frequency will increase from a nominal value of 37,500 Hz in high power mode to 37,522 Hz in low power mode. This difference must be tracked and taken into account for time measurements. However, in systems such as LTE the exact frequencies can be estimated by comparing the low frequency clock provided by the low frequency divider to the network clock in both low and high power modes. The low frequency clock can be calibrated by counting the number of clock pulses between two messages received from the base station. It is not necessary to measure the frequency of the low frequency kHz clock in high power mode or even to know what the difference in frequency is when transitioning between low and high power modes.

Figure 7:
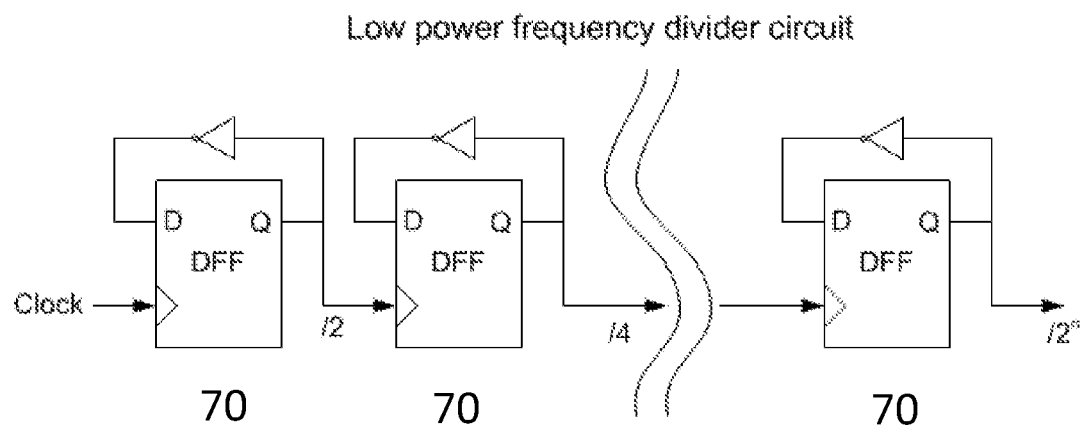
FIG. 7 illustrates a low power frequency divider
Figure 8:
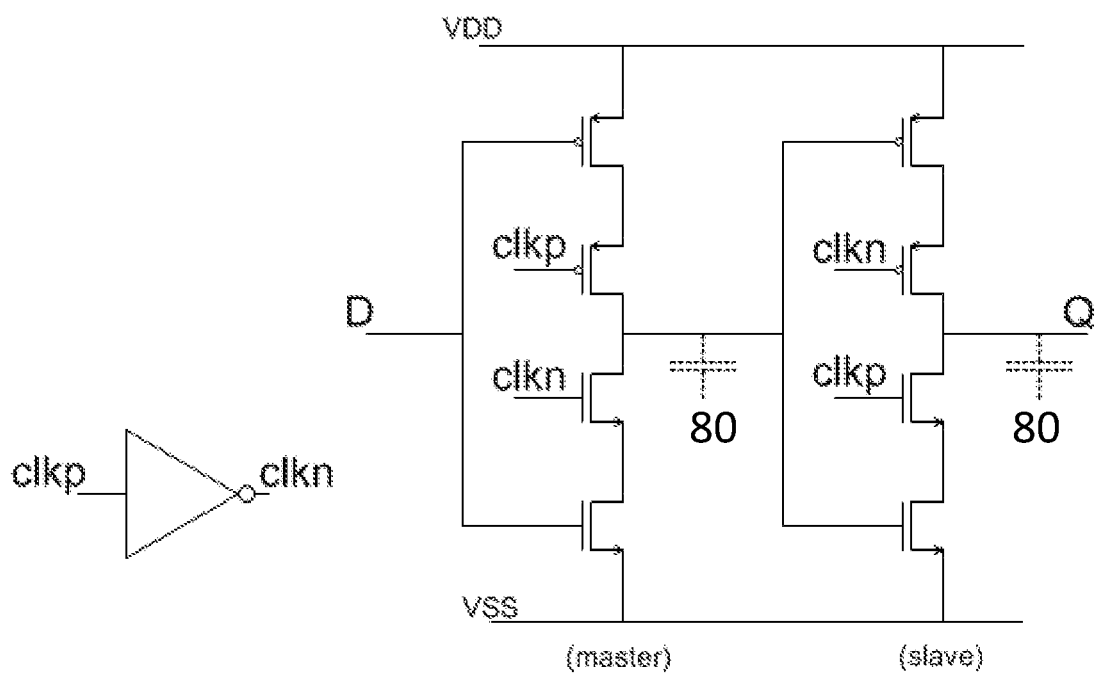
FIG. 8 illustrates architecture of a dynamic d-type flip flop.

As shown in FIG. 7, one solution for a low power frequency divider is division by 1,024 implemented as ten cascaded divide-by-2 circuits based on dynamic D-type flip-flops (DFF), the architecture of which are shown in FIG. 8 by way of an example low power implementation. This architecture uses no standing currents. Power is only consumed when the logic state changes. The very first stage is clocked fastest and consumes roughly the same power as all subsequent stages consume in total. It is therefore advisable to keep gate capacitances low, especially for the very first division stage.

The example of FIG. 7 is known as a ripple counter. Each DFF stage 70 divides the clock frequency by 2 and stages are cascaded to give divide-by-2n. For example, 10 stages gives divide by 1024 yielding a frequency of 38.4 MHz/1024=37.5 KHz.

Turning to FIG. 8, in relation to an example low power implementation of a DFF, upon each phase change of the clock, the data state is stored as charge on the parasitic capacitances, 80 (noting that parasitic capacitance is not an actual component of the circuit). This is a useful low energy circuit due to the minimal number of FETs reducing parasitic C charging, and almost zero shoot-through current owing to the architecture as would be understood.

A method is disclosed whereby the crystal driving circuit may operate in a low power mode and a high power mode. In low power mode, when the high power amplifier and associated load capacitance is selectively isolated from the crystal driving circuit, just the low power amplifier is driving a coupled resonator 21 so that the resonator operates as a low power resonator suitable for division for use as an RTC. In high power mode, when the high power amplifier and associated load capacitance is selectively coupled to the crystal driving circuit, the crystal resonator 21 operates as a high power resonator suitable for RF. The lower power amplifier may be switched off in high power mode.

In relation to the isolating and coupling of the load capacitance associated with the high power amplifier 33 (represented by load capacitors 15,16), by way of background steady-state oscillations may be understood as a continuous exchange of energy between the electric field on the load capacitors and the mechanical stress stored in the quartz crystal resonator 21 (or equivalently modelled as magnetic field of the inductor 11). Any power loss during this exchange is topped up by the trans-conductance of the driving amplifier 33, 34.

Figure 4A:
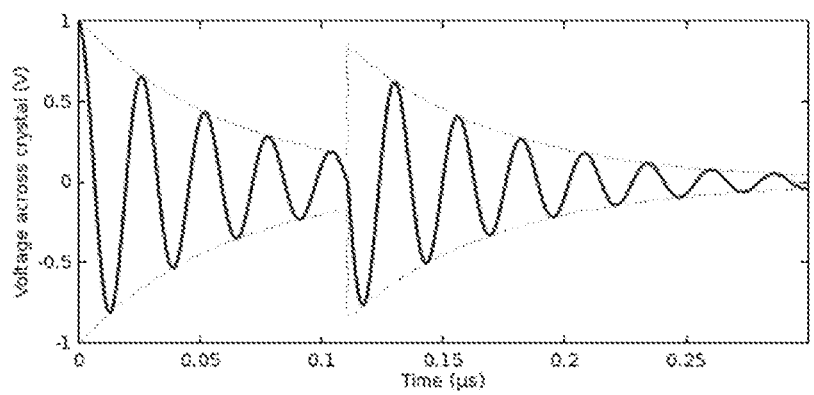
FIG. 4A illustrates reducing load capacitance at V=0.
Figure 4B:
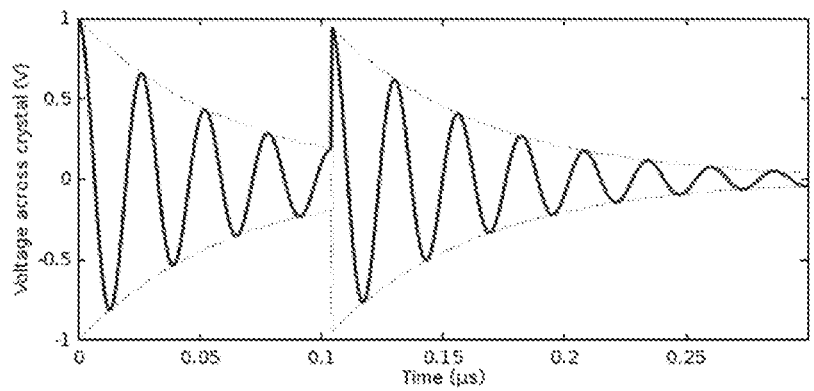
FIG. 4B illustrates reducing load capacitance at $V=V_{peak}$.

When load capacitance is removed from the circuit (the isolating of the method), the voltage amplitude across the crystal 21 increases instantaneously. It does not matter whether the capacitance is removed when charge is stored on load capacitor(s) 15, 16 or when it is discharged (zero voltage across crystal). This is because the energy stored on the tuning capacitors 15, 16 is insignificant compared to the energy on the motional components $L_M$ (11) and $C_M$ (12). FIG. 4A illustrates voltage across a crystal 21 and time, where the load capacitance is reduced at V=0 shortly after 0.1 μs. FIG. 4B illustrates voltage across a crystal 21 and time, where the load capacitance is reduced at $V=V_{peak}$ shortly after 0.1 μs.

As a result, a drastic reduction of capacitance may cause very large voltages which could potentially reduce the lifetime of the crystal driving circuit. Oscillations are therefore preferably dampened to a small amplitude to limit the voltage swing across the crystal before removing load capacitance.

Alternatively, it is possible to let the oscillations reduce naturally but this could take a relatively long time and monitoring would be required to establish when oscillations have reduced sufficiently. Such monitoring would add unwanted power consumption in the low power mode. Another alternative is to rely on clamp or diode devices that may be part of an ESD structure on-chip (31) to absorb excessive voltage peaks.

As is known, a smaller resistor shortens the time constant of the exponential decay. So, when the optional damping resistor 37 is sized appropriately, sufficient damping may be achieved in a few or even a single resonator cycle.

Zero-crossings of the voltage can be detected much more easily than peak voltages as would be understood. The load capacitance may be reduced in small steps with each rising edge of the clock signal (21). This small step reduction may be in addition or alternatively to the use of a damping resistor. Note that the decay time is in the order of a few cycle lengths. Therefore, if all capacitance is removed gradually by a simple state machine over around 5-20 clock cycles (by opening one or more of the switches 15A-C and 16A-C of FIG. 3) the amplitude will naturally settle to an acceptable level so that over-voltage conditions are avoided.

Similarly, when increasing capacitance, the increase is preferably performed in small steps with sufficient time between steps for the resonator amplitude to recover (by closing one or more of the switches 15A-C and 16A-C of FIG. 3).

It is noted that damping resistor 37 may be replaced by alternative designs with equivalent effect. For example, diodes may be used to divert energy into a dissipative load when the voltage falls below or exceeds a certain threshold. This kind of clamping is commonly available on external chip interfaces (on-chip) for ESD protection. If dimensioned correctly, damping resistor 37 is not required.

FIG. 5A illustrates one way to transition from the high power mode 50 to the low power mode 51, and FIG. 5B illustrates one way to transition from the low power mode 51 to the high power mode 50.

In low power mode, the crystal driving circuit is driven by low power amplifier 34. The high power amplifier and associated load capacitance 15, 16 is selectively isolated from the crystal driving circuit. In high power mode, the crystal driving circuit is driven by high power amplifier 33. The high power amplifier and associated load capacitance 15, 16 is selectively coupled to the crystal driving circuit.

Turning to FIG. 5A, starting from high power mode 50, the high power amplifier is disabled at step 52. This can be achieved by operating the high power amplifier in tri-state mode or by powering down the high power amplifier. Next, load capacitance is isolated from the input and output nodes (21A, 21B) of the crystal driving circuit. This can be achieved by opening a switch positioned in series with the input node and before the high power amplifier input and/or opening a switch positioned in series with the output node before the high power amplifier output at step 54. Alternatively or additionally, the previously described small stepped scheme (switches 15A-C, 16A-C) may be used in step 54. Optionally, a damping resistor 37 may be selectively coupled by switch 38 across the input and output nodes at step 53 before step 54 is carried out. As discussed previously, the damping resistor may be used to quash oscillations before the associated load capacitance is removed by step 54.

Turning to FIG. 5B, starting from low power mode 50, where only low power amplifier 34 is driving the crystal driving circuit. The high power amplifier is enabled at step 33. This can be achieved by powering it up. Next load capacitance is coupled to the input and output nodes (21A, 21B) of the crystal driving circuit at step 57. This can be achieved by closing a switch positioned in series with the input node and before the high power amplifier input is closed; and/or closing a switch positioned in series with the output node and before the high powered amplifier output at step 57. Alternatively or additionally, the previously described small stepped scheme (switches 15A-C, 16A-C) with sufficient time between steps for the resonator amplitude to recover may be used in step 57. Optionally, a damping resistor 37, if present, may be selectively isolated by switch 38 from across the input and output nodes at step 55 before step 57 is carried out.

The crystal driving circuit disclosed herein may be implemented on an integrated circuit such as a transceiver, processor, microprocessor, microcontroller, an FPGA, PLD, or other programmable device, or may be implemented on a bespoke integrated circuit device.

The printed circuit board (PCB) layout external 32 to the device 31 containing the crystal driving circuit can aid providing low load capacitance in low power mode by minimising track and pin capacitances so that the low transconductance in low power mode is sufficient to sustain crystal 21 oscillations. This is achieved by keeping track lengths short and the distance to other metal layers of the PCB (e.g. ground layer or V+ layer) large.

The key benefit of the disclosed crystal driving circuit and method is the removal of the need for a 32 kHz quartz resonator and associated external circuit passive components which saves both PCB real estate (approximately 3 $mm^2$) and cost.

An additional benefit is that the frequency tolerance of the sleep clock timer provided by the crystal driving circuit will be improved as a higher frequency resonator naturally varies less with temperature (around +/−10 ppm across −30° C. to 85° C. versus+/−100 ppm for a 32 kHz crystal).

Further, the start-up time for the high frequency crystal will be reduced slightly as it is never fully switched off.

The various methods described above may be implemented by a computer program product. The computer program product may include computer code arranged to instruct a computer or processor to perform the functions of one or more of the various methods described above. The computer program and/or the code for performing such methods may be provided to an apparatus, such as a computer or a processor, on a computer readable medium or computer program product. The computer readable medium may be transitory or non-transitory. The computer readable medium could be, for example, an electronic, magnetic, optical, electromagnetic, infrared, or semiconductor system, or a propagation medium for data transmission, for example for downloading the code over the Internet. Alternatively, the computer readable medium could take the form of a physical computer readable medium such as semiconductor or solid state memory, magnetic tape, a removable computer diskette, a random access memory (RAM), a read-only memory (ROM), a rigid magnetic disc, and an optical disk, such as a CD-ROM, CD-R/W or DVD.

An apparatus such as a computer or processor may be configured in accordance with such code to perform one or more processes in accordance with the various methods discussed herein. Such an apparatus may take the form of a data processing system. Such a data processing system may be a distributed system. For example, such a data processing system may be distributed across a network.

The invention claimed is:

1. A crystal driving circuit comprising:
   a circuit input node and a circuit output node;
   a high power amplifier having a power consumption of more than 100 µW;
   a low power amplifier comprising a power consumption less than 10 µW;
   the circuit being arranged to selectively isolate the high power amplifier and associated load capacitance from the circuit input node and the circuit output node.

2. The circuit of claim 1 wherein being arranged to selectively isolate the high power amplifier and associated load capacitance from the crystal driving circuit comprises the high power amplifier being in a tri-state mode.

3. The circuit of claim 1 further comprising a switch positioned in series with the input node and/or a switch positioned in series with the output node to selectively isolate the high power amplifier and associated load capacitance from the crystal driving circuit.

4. The circuit of claim 2 further comprising at least one switch positioned in series with capacitive elements of the associated load capacitance to selectively isolate the associated load capacitance from the crystal driving circuit.

5. The circuit of claim 1 further comprising a damping resistor coupled in parallel with the input node and the output node and arranged to dampen oscillations and dissipate power from a crystal coupled across the input and output node.

6. The circuit of claim 1 wherein the outputs of the amplifiers are coupled to the output node and the inputs of the amplifiers are coupled to the input node.

7. The circuit of claim 6 wherein the load capacitance of the circuit between the input node and the output node is contained solely on the integrated device.

8. The circuit of claim 1 further comprising a low power frequency divider to provide a frequency signal for a real time clock.

9. The circuit of claim 1 wherein the high power amplifier is coupled to a low noise power supply.

10. The circuit of claim 1 wherein the low power amplifier is coupled to an unregulated power supply.

11. The circuit of claim 1 wherein the circuit is further arranged to selectively isolate the low power amplifier from the crystal driving circuit.

12. The circuit of claim 1 wherein the driving circuit is positioned on an integrated device.

13. A method of driving a crystal driving circuit, wherein the crystal driving circuit comprises a circuit input node and a circuit output node; a high power amplifier having a power consumption of more than 100 µW; a low power amplifier comprising a power consumption less than 10 µW; the circuit being arranged to selectively isolate the high power amplifier and associated load capacitance from the circuit input node and the circuit output node, the method comprising:
   operating in a low power mode whereby the high power amplifier and associated load capacitance is selectively isolated from the crystal driving circuit.

14. The method according to claim 13 wherein selectively isolating the high power amplifier and associated load capacitance from the crystal driving circuit comprises:
   disabling the high power amplifier by operating the high power amplifier in a tri-state mode or powering down the high power amplifier; and then
   opening a switch positioned in series with the circuit input node and before the high power amplifier input; and/or opening a switch positioned in series with the circuit output node before the high power amplifier output.

15. The method according to claim 13 wherein selectively isolating the high power amplifier and associated load capacitance from the crystal driving circuit comprises:
   disabling the high power amplifier by operating the high power amplifier in a tri-state mode or powering down the high power amplifier; and then
   opening at least one switch positioned in series with capacitive elements of the associated load capacitance.

16. The method according to claim 14 wherein selectively isolating the high power amplifier and associated load capacitance from the crystal driving circuit further comprises selectively coupling a damping resistor across the circuit input and circuit output nodes after the disabling the high power amplifier and before the opening a switch.

17. The method according to claim 13 further comprising operating in a high power mode whereby the high power amplifier and associated load capacitance is selectively coupled to the crystal driving circuit.

18. The method according to claim 17 wherein selectively coupled to the high power amplifier and associated load capacitance comprises powering the high power amplifier and operating it in a non tri-state mode, then closing a switch positioned in series with the circuit input node and before the high power amplifier input; and/or closing a switch positioned in series with the circuit output node and before the high powered amplifier output.

19. The method according to claim 18 wherein selectively coupled to the high power amplifier from the crystal driving circuit further comprises selectively isolating a damping resistor from across the circuit input and circuit output nodes before powering the high powered amplifier.

20. A non-transient computer readable medium comprising instructions that when executed by a processor, cause the processor to carry out the method of claim 13.

\* \* \* \* \*